United States Patent [19]

Hidaka et al.

[11] Patent Number: 5,747,220
[45] Date of Patent: May 5, 1998

[54] LIGHT SENSITIVE PLANOGRAPHIC PRINTING PLATE HAVING PARTICULAR DEPOSITED PARTICLES AND PROCESS FOR PRODUCING THE SAME

[75] Inventors: Katsuhiko Hidaka; Katsuhiro Kawabata; Keiko Tamukai, all of Hasaki-machi, Japan

[73] Assignee: Mitsubishi Chemical Corporation, Tokyo, Japan

[21] Appl. No.: 630,255

[22] Filed: Apr. 10, 1996

[30] Foreign Application Priority Data

Apr. 11, 1995 [JP] Japan .................................. 7-109957

[51] Int. Cl.$^6$ .................................................. G03F 7/115
[52] U.S. Cl. ............................. 430/273.1; 430/270.1; 430/300; 430/327; 430/330; 101/130; 101/395; 101/453; 101/463.1

[58] Field of Search ........................ 430/270.1, 273.1, 430/300, 327, 320; 101/130, 395, 453, 463.1

[56] References Cited

U.S. PATENT DOCUMENTS 4,626,484 12/1986 Nishioka et al. ...................... 430/273
5,028,512 7/1991 Nagatani et al. ...................... 430/300

*Primary Examiner*—Christopher G. Young
*Attorney, Agent, or Firm*—Oblon, Spivak, McClelland, Maier & Neustadt, P.C.

[57] ABSTRACT

A light sensitive planographic printing plate have deposited particles on a sensitive layer, each of the said deposited particles comprising a protuberant or bulging portion and a substantially flat base portion spreading around the said protuberant or bulging portion, the said both protuberant or bulging portion and flat base portion being formed integrally with a same material.

12 Claims, 6 Drawing Sheets

LIGHT SENSITIVE PLANOGRAPHIC PRINTING PLATE HAVING PARTICULAR DEPOSITED PARTICLES AND PROCESS FOR PRODUCING THE SAME

BACKGROUND OF THE INVENTION

The present invention relates to a light sensitive planographic printing plate and a process for producing such a plate. More particularly it relates to a light sensitive planographic printing plate having improved performance for vacuum contact time and a process for producing the same.

For contact exposure a original film on a light sensitive planographic printing plate, there has generally been employed a method wherein the original film and the light sensitive planographic printing plate are held in close contact with each other between a glass plate of a vacuum frame and a rubber sheet (this method is called vacuum contact method). In this vacuum contact method, various means for providing a desired contacting state over the whole surface of the plate to be contacted are known.

For example, in Insatsu Zasshi (Printing Magazine), 53(10), 23 (1970) by Inoue and Iino, and Insatsu Joho (Printing Information), 33(11), 90 (1973) by Ishiyama, a method is described wherein a solid powder such as talc is sprinkled and deposited on the surface of the sensitive layer of a light sensitive planographic printing plate prior to the contact exposure by a mechanical means without using a dispersing medium other than a gas such as air (this method is hereinafter referred to as powdering). The powdering is capable of improving a performance for vacuum contact time by simply sprinkling commercially available talc or the like on the plate by a spray gun or a powder-puff, but this method also has disadvantages in that the solid powder is scattered in the workroom to pollute air in the working environment, causing various hindrances to the plate making process.

In Japanese Patent Application Laid-open (KOKAI) No. 51-98505 is disclosed a method of roughing by dispersing a wax-like or finely powdered resin having mould releasability in a low-boiling point solvent, and air-spraying the obtained dispersion on a plate surface. In this case, however, the coating portion on the plate tends to come off due to weak adhesion to the plate surface. Further, the use of an organic solvent is undesirable from the standpoint of safety in the plate making operation. Thus, further improvements of the adhesiveness of the coating to the sensitive layer and the performance for vacuum contact time of the plate have been desired.

Japanese Patent Application Laid-open (KOKAI) No. 61-28986 discloses a method of forming a micropattern consisting of a coated portion and a non-coated portion by spraying and drying an aqueous solution in which a resin has been dissolved or dispersed. However, in this method, it is desired to further improve the adhesiveness to the sensitive layer and the performance for vacuum contact time of the plate as well as its pressure resistance to stand roller conveyance in the plate making process.

Japanese Patent Application Laid-open (KOKAI) No. 55-101949 proposes a method of forming a mat layer on the sensitive layer by preheating the back side of a light sensitive planographic printing plate by preheat rolls, then powdering a heat-fusible fine powder, and pressure bonding the fine powder to the plate by heated rolls (this method is hereinafter referred to as heat fusion method). In this method, it is desired to further improve the adhesiveness to the sensitive layer, the performance for vacuum contact time and the pressure resistance.

Thus, in view of the prior art, it is necessary to enlarge the contact area between each deposited particle and the sensitive layer, and to increase the height of the deposited particles for improving the vacuum contact performance of the plate.

According to the conventional spray method, however, the shape of the deposited particles created from the sprayed coating solution is substantially decided (usually elliptical or partially spherical) by each surface tension of the coating solution and that of the surface of the sensitive layer on which the coating solution is applied. Here, the height of the deposited particles, and the contact area between each particle and the sensitive layer have the antagonistic tendencies. That is, supposing the droplets of the sprayed coating solution are of a same volume, when the contact area between each deposited particle and the surface of the sensitive layer is enlarged for enhancing an adhesiveness of the deposited particles, the height of each deposited particles lowers, making it difficult to improve a performance for vacuum contact time of the plate.

Also, according to the conventional spray method in which the shape of the deposited particles created from the sprayed coating solution is substantially decided by each surface tension of the coating solution and that of the surface to be applied of the sensitive layer, the shape of the deposited particles is greatly affected by the surface tension of the coating surface thereof and is changeable according to the type of the light sensitive planographic printing plate used, so that the performance for vacuum contact time also vary depending on the type of the planographic printing plate.

As a solution to this problem, it has been proposed to adjust the surface tension of the coating solution in accordance with the surface tension of the surface of the sensitive layer by changing the composition of the coating solution, or to adjust the surface tension of the surface of the sensitive layer by changing the composition of the sensitive layer so as to make the shape of the deposited particle constant. In this case, however, the possible range of compositional change of the coating solution and the sensitive layer is very limited because of many restrictions by a coatability of the coating solution, a performance and a coatability of the sensitive layer, etc., and it is difficult with such adjustment of surface tension of the coating solution and the sensitive layer to make the shape of the deposited particles regardless of the type of the light sensitive planographic printing plate used constant. It is also undesirable in terms of operation efficiency in the plate making process to change the coating solution according to the type of the printing plate.

As seen from the above, a light sensitive planographic printing plate having an excellent performance for vacuum contact time and an improved adhesiveness to the sensitive layer and a pressure resistance has been desired.

As a result of extensive studies by the present inventors for overcoming the prior art problems and providing an excellent light sensitive planographic printing plate, it has been found that by forming deposited particles with such a specific shape on a mat layer, an adhesiveness to the sensitive layer, a pressure resistance and a performance for vacuum contact time of the obtained light sensitive planographic printing plate have all been remarkably improved. The present invention has been attained on the basis of the finding.

SUMMARY OF THE INVENTION

An object of the present invention is to provide a light sensitive planographic printing plate having an excellent performance for vacuum contact time and an adhesiveness to the sensitive layer as well as a high pressure resistance.

Another object of the present invention is to provide a light sensitive planographic printing plate capable of desired vacuum contact by use of only a small amount of a mat material and also having an excellent adaptability for the working environment.

To accomplish the aims, in a first aspect of the present invention, there is provided a light sensitive planographic printing plate having deposited particles on a sensitive layer, each of the said deposited particles comprising a protuberant or bulging portion and a substantially flat base portion spreading around the said protuberant or bulging portion, the said both protuberant or bulging portion and flat base portion being formed integrally with a same material.

In a second aspect of the present invention, there is provided a process for producing a light sensitive planographic printing plate, which comprises heating the surface of a sensitive layer of the light sensitive planographic printing plate comprising a support and the said sensitive layer disposed thereon, and then spraying on the heated sensitive layer surface an aqueous solution containing a resin dissolved therein.

DETAILED DESCRIPTION OF THE INVENTION

The light sensitive planographic printing plate of the present invention has specific particles deposited on its sensitive layer, each of the said deposited particles comprising a central protuberant or bulging portion and a substantially flat base portion spreading around the bottom of the said protuberance or bulging portion (this shape being hereinafter referred to as "brimmed hat-like shape"), the said protuberant or bulging portion and flat base portion being formed integrally with a same material. Such a light sensitive planographic printing plate of the present invention can be easily obtained by heating the surface of the sensitive layer of the light sensitive planographic printing plate comprising a support and the said sensitive layer formed thereon, and spraying on the said heated sensitive layer surface an aqueous solution containing a resin dissolved therein.

The shape of the particles deposited on the sensitive layer in the light sensitive planographic printing plate according to the present invention is explained below with reference to the accompanying drawings.

Figure 1A:
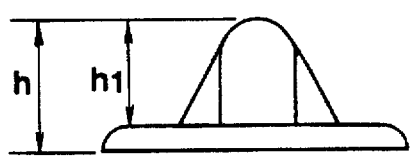
FIG. 1(a) and FIG. 1(b) are schematic illustrations of a deposited particle according to the present invention.
Figure 1B:
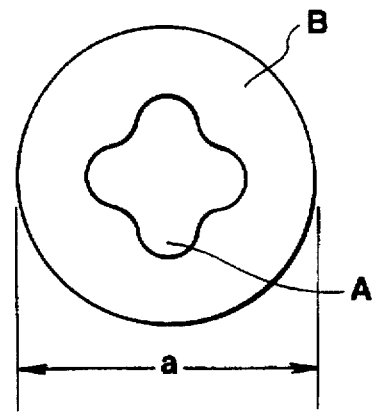
Figure 2A:
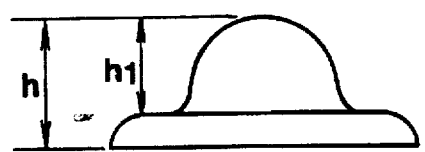
FIG. 2(a) and FIG. 2(b) are schematic illustrations of another deposited particle according to the present invention.
Figure 2B:
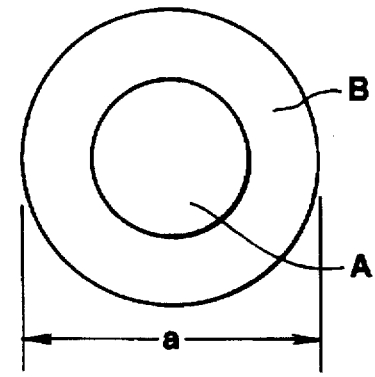
Figure 3A:
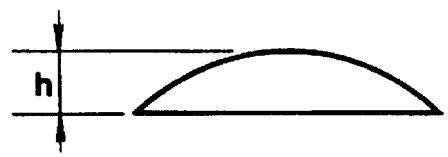
FIG. 3(a) and FIG. 3(b) are is schematic illustrations of a deposited particle according to the prior art.
Figure 3B:
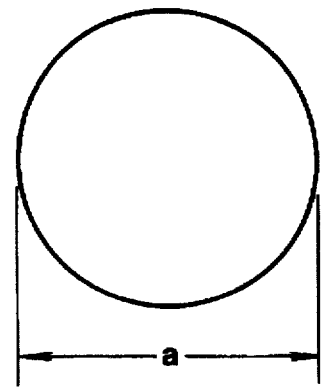

FIG. 1(a) and FIG. 1(b), and FIG. 2(a) and FIG. 2(b) each show schematically a side view and a top plan view of a deposited particle according to the present invention, and FIG. 3(a) and FIG. 3(b) each show schematically a side view and a top plan view of a conventional deposited particle.

The brimmed hat-shaped particle according to the present invention comprises at least a base portion attached to the surface of the sensitive layer and a protuberance or bulging portion formed at a central portion of the said base portion. These portions are not specifically defined demensionally as far as the bottom area of the said base portion is greater than that of the protuberance or bulging portion.

The top end of the deposited particle may be shaped, for instance, cruciform in top plan view as shown in FIG. 1(b) or circular as shown in FIG. 2(b).

The area ratio of the deposited particle according to the present invention is usually in a range from about 5% to about 80%, preferably from about 10% to about 70%, more preferably from about 20% to about 60%.

The area ratio of the bottom area of the protuberance or bulging portion to the bottom area of the base portion (hereinafter referred to as "area ratio") represented by the following formula:

Area ratio (%) = bottom area of the protuberance or bulging portion/base area of the base portion × 100 is determined by SEM photographing the deposited particle from right above thereof (namely from a photographing angle of 0°) and measuring the bottom areas of the protuberance or bulging portion and the base portion from the SEM photograph by a high-speed image processor analyzer. In FIG. 1(a) and FIG. 1(b), and FIG. 2(a) and FIG. 2(b) are, the bottom area of the protuberance or bulging portion is indicated by A and that of the base portion by B.

The major axial diameter of the base portion of the brimmed hat-shaped particle is usually selected from a range of 10 to 100 μm, preferably 20 to 60 μm, more preferably 20 to 50 μm. The major axial diameter is a maximum axial diameter of the base portion of the brimmed hat-shaped particle and is indicated by a in each of FIG. 1(b) and FIG. 2(b).

The height of the brimmed hat-shaped particle is usually selected from a range of 3 to 20 μm, preferably 5 to 15 μm, more preferably 7 to 13 μm. The height of the particle is indicated by h in each FIG. 1(a) and FIG. 2(a). The ratio of the height of the protuberance or bulging portion to the overall height of the particle (h) (hereinafter referred to as "height ratio") represented by the following formula:

Height ratio (%) = height of the protuberance or bulging portion/height of the particle × 100 may be broadly in a range from about 10% to about 95%, but the height ratio is preferably in a range from about 30% to about 90%, more preferably from about 50% to about 80%. The height of the protuberance or bulging portion is indicated by h1 in each FIG. 1(a) and FIG. 2(a). Generally, it is preferable to increase the area ratio proportionally to the height ratio.

The reason why the brimmed hat-shaped deposited particles described above can produce the said prominent effects is not yet clarified, but it is considered that the brimmed hat-shaped deposited particles having a double-storied configuration composed of a base portion and a protuberance or bulging portion contribute to the improvement of performance for vacuum contact time since these particles, if supposed to be all same in volume, are larger in contact area with the sensitive layer and in height as well than the elliptical or partially spherical deposited particles. Also, the brimmed hat-shaped deposited particles according to the present invention, although having the said double-storied configuration, are very high in dimensional stability as the said both base portion and protuberance or bulging portion are formed integrally with a same material.

The brimmed hat-shaped particles according to the present invention are composed of a resin which is at least soluble or dispersible in the aqueous solutions. The "aqueous solutions" referred to herein mean solutions which substantially comprise water and may contain organic solvents.

The organic solvents which can be contained in the said aqueous solutions include high boiling point solvents having a higher boiling point than water for preventing evaporation of the aqueous solution, solvents for adjusting viscosity and surface tension of the solution, and solvents for elevating solubility of the resin when dissolved in water used as solvent. Examples of these solvents are ethylene glycol, ethylene glycol monomethyl ether, ethylene glycol monoethyl ether, ethylene glycol monomethyl ether acetate, diethylene glycol monomethyl ether, propylene glycol ethyl ether, propylene glycol methyl ether, dipropylene glycol methyl ether, and tripropylene glycol methyl ether. Of these solvents, ethylene glycol, ethylene glycol monomethyl ether and ethylene glycol monoethyl ether are preferred.

The content of the organic solvent in the aqueous solution is properly selected depending on the type of the light sensitive planographic printing plate to be treated, coater, coating atmosphere, influence on the sensitive layer, kind and amount of the resin used, working environment and other factors. However, the content of the organic solvent of not more than 20% by weight, more preferably 5 to 10% by weight is preferred.

The resin soluble and dispersible in the said aqueous solutions can be selected from a wide scope of resins as far as the aqueous solution of such resin is capable of spraying and the particles formed from such resin have proper adhesiveness to the sensitive layer to produce the desired effect as a mat layer and be easily eliminated by development of the light sensitive planographic printing plate. Specifically, in case where the sensitive layer comprises a negative sensitive composition containing a diazo compound, copolymers of the following monomers (a), (b) and (c) having the described functions are used.

Monomer (a) is a component for imparting solubility in the developer to the plate. Examples of monomer (a) are p-styrenesulfonic acid, 2-acrylamido-2-methylpropanesulfonic acid, ethylenesulfonic acid, and sodium or potassium salts thereof.

Monomer (b) is a component for imparting adhesiveness to the sensitive layer surface. Therefore, a glass transition temperature (Tg) of its homopolymer is not less than 60° C. and the molecular weight between cross-links (hereinafter referred to as Me) of its homopolymer is should be not less than 4,000. If Me is less than 4,000, brittle fracture of the copolymer particles tends to take place, and also the copolymer particles may be cracked or come away during storage. More detailed discussions on Me are given in Polymer Preprints, Japan, Vol. 138, No. 10 (1989); J. Macromol. Sci. Phys. B19(14), 605–622 (1981); etc. Examples of monomer (b) include ethyl methacrylate, 2-ethylbutyl methacrylate, n-hexyl methacrylate, n-octyl methacrylate, styrene and the like.

Monomer (c) is a component for imparting mechanical strength to the plate. Tg of its homopolymer is not less than 60° C. and Me is less than 4,000. Use of this monomer contributes to enhancing mechanical strength of the copolymer. A typical example of this monomer is methyl methacrylate.

Regarding the contents of these monomer units, the content of the monomer (a) is preferably 5 to 50 mol %, more preferably 20 to 40 mol %, the content of the monomer (b) is preferably 10 to 70 mol %, more preferably 20 to 40 mol %, and the content of the monomer (c) is preferably 20 to 80 mol %, more preferably 30 to 50 mol %. If the content of the monomer (a) is less than 5 mol %, the solubility of the copolymer resin in the developer may lower, and if the content of the monomer (a) is more than 50 mol %, the produced particles become susceptible to the influence of moisture in the air and lower in strength, and also deposit of the particles on the sensitive layer may be lowered. If the content of the monomer (b) is less than 10 mol %, the adhesiveness of the deposited particles to the sensitive layer surface may lower, and if the content of the monomer (b) is more than 70 mol %, the pressure resistance of the deposited particles may be deteriorated. If the content of the monomer (c) is less than 20 mol %, the produced particles may lower in hardness and pressure resistance, and when the content of the monomer (c) is more than 80 mol %, the adhesiveness of the particles to the sensitive layer surface may lower.

In case where the sensitive layer is made of a positive sensitive composition containing a quinonediazide compound and an alkaline soluble resin, usually copolymers of the following monomers (d) and (e) are used as the resin soluble or dispersible in the said aqueous solutions.

Monomer (d) is a component for imparting the resin solubility in the developer, and its examples include acrylic acids such as acrylic acid, sodium acrylate, potassium acrylate and ammonium acrylate; methacrylic acids such as methacrylic acid, sodium methacrylate, potassium methacrylate and ammonium methacrylate; maleic acids such as maleic acid, sodium maleate, potassium maleate and ammonium maleate; and itaconic acids such as itaconic acid, sodium itaconate, potassium itaconate and ammonium itaconate.

Monomer (e) is a component for imparting mechanical strength and adhesiveness to the sensitive layer surface, and the substances mentioned above as examples of monomer (b) can be used as examples of monomer (e).

The content of the monomer (d) is 5 to 50 mol %, preferably 12 to 20 mol %, and the content of the monomer (e) is residual amount, that is, 50 to 95 mol %, preferably 80 to 88 mol %. If the content of the monomer (d) is less than 5 mol %, the produced copolymer may lower in solubility in the developer, and if the content of the monomer (d) is more than 50 mol %, the deposited particles become susceptible to the influence of moisture in the air, and also lower in strength and adhesiveness to the sensitive layer surface.

The brimmed hat-shaped particles of the present invention may contain other water-soluble substance(s) and fillers such as powder of an inorganic particulate material, powder of a polymer, etc., which exert no influence on the sensitive layer or the said resin.

The brimmed hat-shaped particles according to the present invention can be formed, for example, by a process comprising the steps of heating to a specific temperature the surface of the sensitive layer of a light sensitive planographic printing plate comprising a support and the said sensitive layer formed on the support, spraying an resin-dissolved aqueous solution having a specific viscosity on the said heated sensitive layer surface, and if necessary, drying the sprayed solution.

The temperature at which the surface of the sensitive layer of the light sensitive planographic printing plate is heated is a factor that decides the shape of the deposited particles, so that it needs to be selected by taking into consideration of the properties of the coating solution and the resin used. It is imperative to select a temperature which do not cause degeneration of both the support and the sensitive layer. Generally, a heating temperature is selected from a range within which a temperature of the sensitive layer surface become about 70° to 130° C., preferably about 75° to 90° C.

The heating method is not restricted. Desired heating can be accomplished, for instance, by carrying the light sensitive planographic printing plate on heated rolls in such a manner that the side of the plate not having the sensitive layer contact the said heated rolls, or by passing the light sensitive planographic printing plate through a heated atmosphere.

Then an aqueous solution containing a resin dissolved therein is sprayed on the sensitive layer surface. The resin is dissolved in an aqueous solution in the usual method, so that a viscosity of the solution becomes in the range from 1 to 80 cps, preferably 5 to 30 cps, more preferably 10 to 30 cps.

The concentration of the deposited particle-forming substance in the aqueous solution is usually selected from a range of 5 to 40 wt %, preferably 20 to 30 wt %, more preferably 20 to 25 wt %.

For spraying such an aqueous solution of resin on the sensitive layer surface, various known methods such as air spraying method, airless spraying method, electrostatic air spraying method, electrostatic spray coating method, etc., can be employed. The spraying strength should be properly adjusted, because a too high spraying strength tends to lower the height of the protuberances, while a too week spraying strength tends to increase the ratio of the sectional area of the protuberance or bulging portion to the sectional area of the base portion.

When the said aqueous solution is sprayed in the manner described above, the peripheral portion of a deposited particle composed of the aqueous solution, which is contacted with the sensitive layer, is dried and solidified before the droplet of the deposited particle restore the normal form as a whole, thereby forming a wide contact area of the deposited particle with the sensitive layer.

In the present invention, drying may be conducted after completion of the above operation, in case where the light sensitive planographic printing plate to which the aqueous solution has been sprayed is not sufficiently dried by the heat of the sensitive layer surface, or in case where the amount of the residual solvent of the dried and solidified resin is large. Usual methods such as hot air blowing may be used for drying.

In the present invention, the light sensitive planographic printing plate having the brimmed hat-shaped particles deposited on its surface comprises a support and a sensitive layer provided thereon, and remarkable effects of the present invention is obtained especially when the light sensitive planographic printing plate is used for lithographic printing. As the support for the light sensitive planographic printing plate, there can be used various known types such as shown in Japanese Patent Application Laid-open (KOKAI) No. 55-128494, Japanese Patent Application Laid-open (KOKAI) No. 58-182636 and Japanese Patent Application Laid-open (KOKAI) No. 62-42160. Also, various types of sensitive layer such as a sensitive layer comprising a diazo resin, a sensitive layer comprising an o-quinonediazide compound, a sensitive layer comprising a sensitive azide compound, a sensitive layer comprising a photopolymerizable composition, a sensitive layer comprising a sensitive resin, etc., for example, described in the above-cited Japanese KOKAIs, can be used. The thickness of the sensitive layer is 0.1 to 7 $g/m^2$, preferably 0.5 to 3 $g/m^2$.

According to the present invention, it is possible to obtain a double-sided type light sensitive planographic printing plate with an excellent performance for vacuum contact time equally on both sides and to promote efficiency of the plate making process. Also, coating can be performed with a safe and simple apparatus in the plate producing process.

According to the light sensitive planographic printing plate and a process for producing the same of the present invention, the adhesiveness to the sensitive layer, the pressure resistance and the performance for vacuum contact time can all be remarkably improved.

EXAMPLES

The present invention will be described in more detail with reference to the examples and comparative examples. It will be understood, however, that these examples are merely intended to be illustrative and not to be construed as limiting the scope of the invention.

Reference Example 1 (Synthesis of diazo resin)

3.5 g (25 mmol) of p-hydroxybenzoic acid and 21.75 g (75 mmol) of p-diazodiphenylamine sulfate were dissolved in 90 g of concentrated sulfuric acid under ice cooling. To this solution was slowly added 2.7 g (90 mmol) of paraformaldehyde, taking care so that the reaction temperature wouldn't exceed 10° C. After stirring the reaction solution for 2 hours, one liter of ethanol was added and the produced precipitate was filtered out, washed with ethanol, and then dissolved in 200 ml of pure water, followed by addition of an aqueous solution of 10.5 g of zinc chloride. The produced precipitate was again filtered out, washed with ethanol and dissolved in 300 ml of pure water, and then an aqueous solution of 13.7 g of ammonium hexafluorophosphate was added. The resultantly produced precipitate was further filtered out, washed with water and ethanol and then dried at 25° C. for one day to obtain diazo resin 1.

Reference Example 2 (Preparation of positive-working planographic printing plate)

A 0.3 mm thick aluminum plate (alloy: 1050; temper: H16) was subjected to degreasing in a 5% aqueous solution of sodium hydroxide at 65° C. for 13 seconds, then washed with water, immersed in a 30% aqueous solution of hydrochloric acid at 25° C. for 30 seconds for neutralization and again washed with water. This aluminum plate was subjected to an electrolytic surface roughening treatment in a 1.5 wt % aqueous solution of hydrochloric acid at 25° C. for 3 seconds applying an alternating current at a current density of 60 $A/dm^2$, then subjected to desmutting in a 5% aqueous solution of sodium hydroxide at 60° C. for 10 seconds, and subjected to anodic oxidizing in a 30% sulfuric acid solution under the conditions of 30° C., 5 $A/dm^2$ and 30 seconds.

The thus treated aluminum plate was immersed in a 0.5% aqueous solution of carboxymethyl cellulose at 90° C. for 30 seconds, then washed with water and dried at 80° C. for 5 minutes to produce a support.

On this support was applied a light-sensitive solution 1 of the following composition, to so that a dry coating film thickness became 2.0 g/m², and dried to prepare a light sensitive planographic printing plate.

Composition of light-sensitive solution 1

| | |
|---|---|
| Novolak resin (phenol/m-cresol/p-cresol molar ratio = 10/54/36; weight average molecular weight: 4,000) | 6.7 g |
| Ester of o-naphthoquinonediazido-5-sulfonyl chloride and pyrogallolacetone resin (condensation rate: 30%) | 1.5 g |
| Polyethylene glycol #2000 | 0.1 g |
| Victoria Pure Blue BOH (produced by Hodogaya Chemical Co., Ltd.) | 0.08 g |
| 2,4-bis(trichloromethyl)-6-(p-methoxystyryl)-s-triazine | 0.10 g |
| Cis-1,2-cyclohexanecarboxylic acid | 0.2 g |
| Methyl cellosolve | 100 ml |

Reference Example 3 (Preparation of negative-working planographic printing plate)

A 0.3 mm thick aluminum plate (quality: 1050; tempering: H16) was degreased in a 5% aqueous solution of sodium hydroxide at 65° C. for 13 seconds, then washed with water, immersed in a 30% aqueous solution of hydrochloric acid at 25° C. for 30 seconds for neutralization and again washed with water. This aluminum plate was subjected to an electrolytic surface roughening treatment in a 1.5 wt % aqueous solution of hydrochloric acid at 25° C. for 16 seconds applying an alternating current density of 60 A/dm², then subjected to desmutting in a 5% aqueous solution of sodium hydroxide at 60° C. for 10 seconds, and then subjected to anodic oxidizing in a 30% aqueous solution of sulfuric acid under the conditions of 30° C., 5 A/dm² and 24 seconds of treatment.

The place was then immersed in a 1% aqueous solution of sodium nitrite at 90° C. for 10 seconds, then subjected to pore closing treatment in a 1% aqueous solution of sodium metasilicate at 85° C. for 30 seconds or sensitive planographic plate.

On the thus prepared aluminum plate was applied a light-sensitive solution 2 of the following composition (a methyl cellosolve solution arranged to have a solid concentration of 10 wt %), so that the dry coating weight became 1.6 g/m², to prepare a light sensitive planographic printing plate.

Composition of light-sensitive solution 2

| | |
|---|---|
| Poly(N-(4-hydroxyphenyl)methacrylamide/acrylonitrile/methyl methacrylate/methacylic acid copolymer (molar ratio: 25/25/42/8; Mw: 42,000) | 100 wt parts |
| Diazo resin 1 | 10 wt parts |
| JURYMER Ac-10L (Nippon Junyaku Co., ltd.) | 6 wt parts |
| Victoria Pure Blue BOH (Hodogaya Chemical Co., Ltd.) | 2 wt parts |

Examples 1–7 and Comparative Examples 1–2

The light sensitive planographic printing plates produced in Reference Examples 2 and 3 were heated, so that the sensitive layer surfaces of the said plates had the temperatures shown in Table 1. Then the aqueous solutions of the compositions shown in Table 1 were applied on the said sensitive layer surfaces by an air spray (IWATA N-88 (trade name) manufactured by Iwata Air Compressor Mfg. Co., Ltd.) to form the mat layers. The coating weight of each mat layer was 0.1 g/m², and the amount of the deposited particles was 20 to 50 particles per square millimeter (mm²). The light sensitive planographic printing plate of Reference Example 2 was used in Examples 1–3 and Comparative Example 1, and the light sensitive planographic printing plate of Reference Example 3 was used in Examples 4–6 and Comparative Example 2.

The size (height h and diameter a of the base portion; see FIGS. 1–3) was measured from the SEM photographs taken at an angle of 85°. The area ratio (A/B×100; see FIGS. 1 and 2) of the deposited particles was calculated by taking the SEM photographs of the particles at an angle of 0° and measuring by a high-speed image processor analyzer/analyzer specified below. The SEM photographs are shown in FIGS. 4–12.

High-speed image processor analyzer/analyzer
  LUZEX IIIU manufactured by NIRECO Co., Ltd.
  Camera: CCD Model XC007 manufactured by Sony Corp.
  Lens: FUJINON-TV·Z, Microlens: 1.000 mm The adhesiveness to the sensitive layer, performance for vacuum-contact time and pressure resistance of the deposited particles were measured in the following ways, the results being shown in Table 1.

Adhesiveness

Using a rubbing tester Gakushin type for the dyed material fastness (manufactured by Daiei Kagaku Seiki Mfg. Co., Ltd.), the mat layer at the surface of each light sensitive planographic printing plate was rubbed with a white cotton cloth (kind: calico, symbol: b) by pressedly passing on the mat layer 5 times back and forth under a load of 800 g. The numbers of mats before and after rubbing at the same site were counted, and the mat adhesiveness was determined from the following formula:

Adhesiveness = (Number of mats after rubbing)/(number of mats before rubbing) × 100

Performance for vacuum contact time

Smoothness of the light sensitive planographic printing plate was measured by using SMOOSTER Type SM-6B manufactured by Toei Electronics Co., Ltd. This smoothness is an index of readiness for venting of air between the mat layer and the film used in printing. The greater the value of smoothness, the better are the performance for vacuum contact time. Therefore, evaluation was made from the value of this smoothness according to the following criterion:

| SMOOSTER value (mmHg) | Rating | Recommended vacuum contact time (sec) |
|---|---|---|
| >300 | ○ | <30 |
| 250–300 | Δ | 30–40 |
| <250 | × | >40 |

Recommended vacuum con tact time is the value determined from the interrelation between the SMOOSTER value and the vacuum contact time (the time required for reaching a desired state of vacuum contact of the light sensitive planographic printing plate in a vacuum frame Model KDP1 manufactured by Tokyo Kamo Denki Kenkyusho Ltd.).

Pressure resistance

After forming the mat layer, the mat layer was pressed under a load of 0.23 kg/cm² at 45° C. for 10 seconds, and the degree of collapse of the deposited particle was determined by the SEM photographs. The evaluation criterion was as follows.

| Collapse | Rating |
| --- | --- |
| <10% | ○ |
| 10–40% | Δ |
| >40% | × |

The symbols used for the resin compositions in Table 1 indicate the following compounds:

MMA: methyl methacrylate
AA: acrylic acid
EMA: ethyl methacrylacrylate
AMPS: 2-acrylamido-2-methylpropanesulfonic acid EG in "Solvent" represents ethylene glycol, and the "Size h/a" is the ratio of the mat height h (μm) to the diameter a (μm) of the maximum axial diameter of the base portion of the brimmed hat-shaped particle as illustrated in FIGS. 1–3.

TABLE 1

| | Resin composition (numerals: ratios of the respective components) | Solid content (wt %) in aqueous solution | Solvent: water (wt %)/ EC (wt %) | Viscosity (cps) |
| --- | --- | --- | --- | --- |
| Ex. 1 | EMA80/AA20 | 23 | 95/5 | 14.5 |
| Ex. 2 | EMA80/AA20 | 23 | 95/5 | 14.5 |
| Ex. 3 | EMA80/AA20 | 23 | 95/5 | 14.5 |
| Comp. Ex. 1 | EMA80/AA20 | 23 | 95/5 | 14.5 |
| Ex. 4 | MMA45/EMA30/AMPS25 | 25 | 95/5 | 25.1 |
| Ex. 5 | MMA45/EMA30/AMPS25 | 23 | 95/5 | 19.5 |
| Ex. 6 | MMA45/EMA30/AMPS25 | 21 | 95/5 | 9.0 |
| Comp. Ex. 2 | MMA45/EMA30/AMPS25 | 25 | 95/5 | 25.1 |

| | Sensitive layer surface temperature (°C.) | Adhesiveness (%) | Performance for vacuum contact time | Pressure resistance |
| --- | --- | --- | --- | --- |
| Ex. 1 | 90 | 82 | ○ | ○ |
| Ex. 2 | 80 | 83 | ○ | ○ |
| Ex. 3 | 70 | 85 | ○ | ○ |
| Comp. Ex. 1 | 20 | 78 | × | ○ |
| Ex. 4 | 80 | 83 | ○ | ○ |
| Ex. 5 | 80 | 85 | ○ | ○ |
| Ex. 6 | 80 | 90 | Δ | ○ |
| Comp. Ex. 2 | 20 | 80 | × | ○ |

Figure 4:
FIG. 4 is an electron micrograph (85°, 2,000X magnification) of the deposited particles in Example 1.
Figure 5:
FIG. 5 is an electron micrograph (85°, 2,000X magnification) of the deposited particles in Example 2.
Figure 6:
FIG. 6 is an electron micrograph (85°, 2,000X magnification) of the deposited particles in Example 3.
Figure 7:
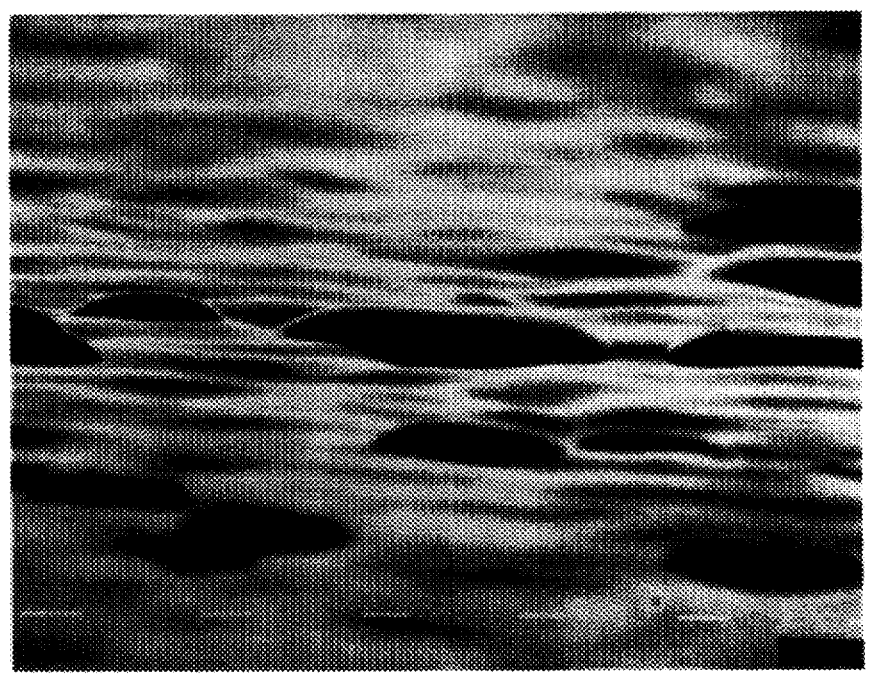
FIG. 7 is an electron micrograph (85°, 2,000X magnification) of the deposited particles in Comparative Example 1.
Figure 8:
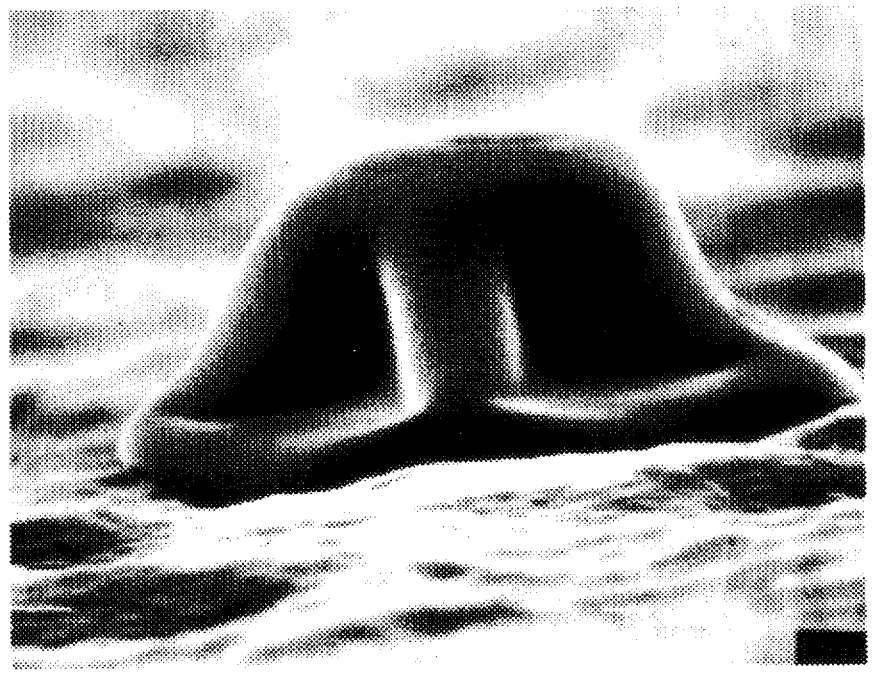
FIG. 8 is an electron micrograph (85°, 3,500X magnification) of a deposited particle in Example 4.
Figure 9:
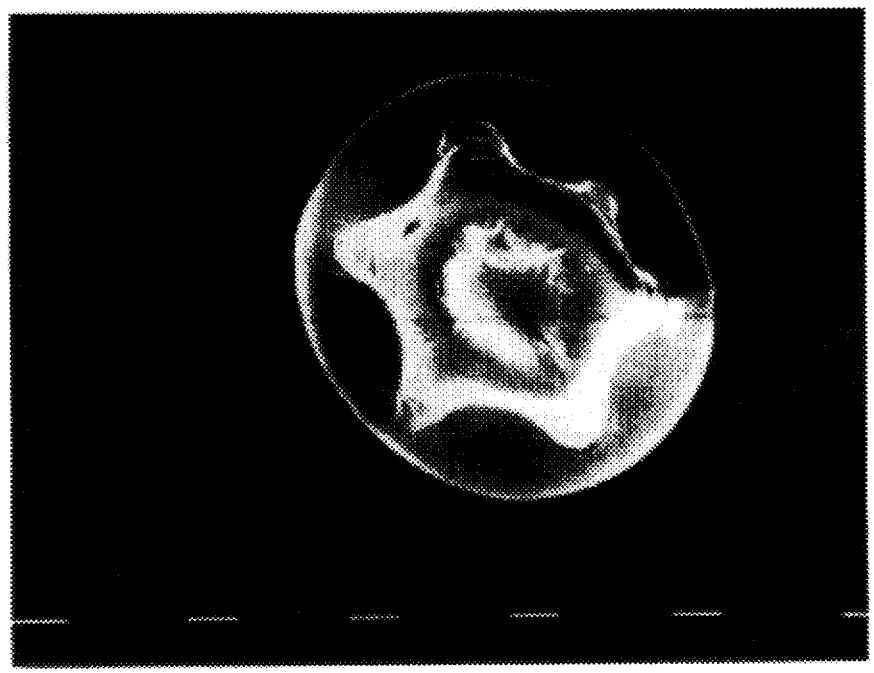
FIG. 9 is an electron micrograph (0°, 2,000X magnification) of the top of the deposited particle in Example 4.
Figure 10:
FIG. 10 is an electron micrograph (85°, 2,000X magnification) of a deposited particle in Example 5.
Figure 11:
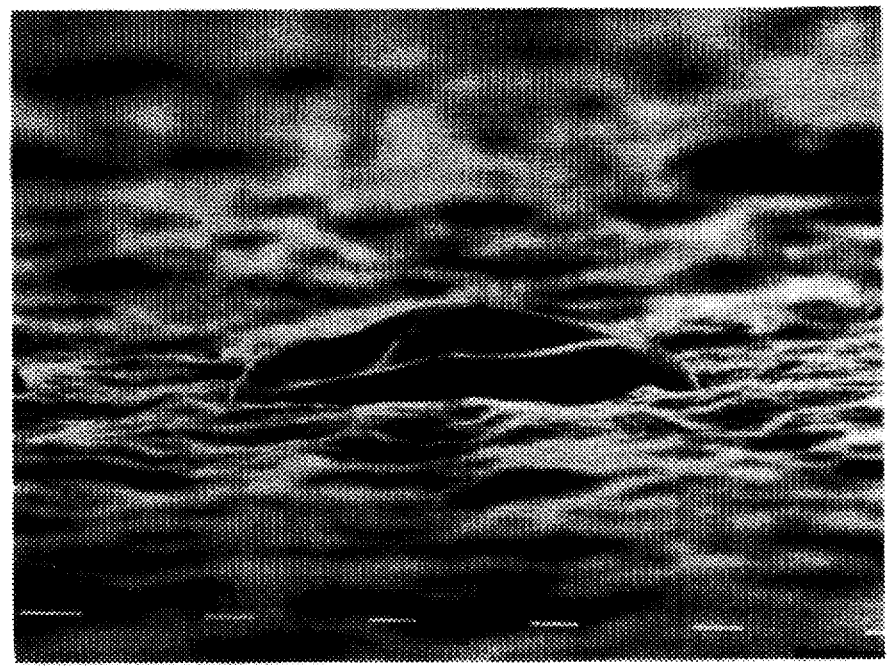
FIG. 11 is an electron micrograph (85°, 2,000X magnification) of a deposited particle in Example 6.
Figure 12:
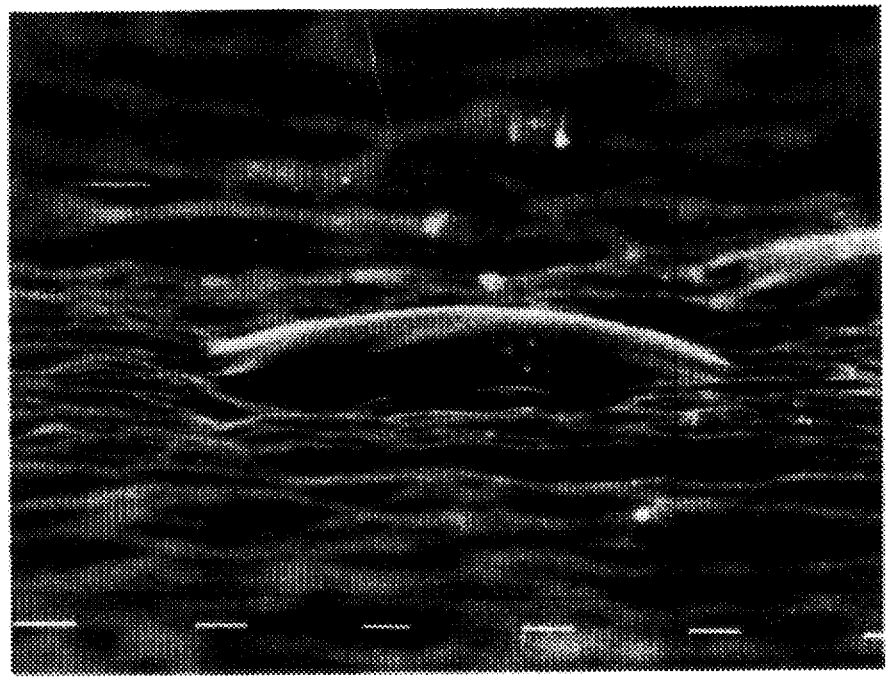
FIG. 12 is an electron micrograph (85°, 2,000X magnification) of a deposited particle in Comparative Example 2.

| | Side views of deposited particles (SEM photographs) | Suitableness for forming brimmed hat-like bumps | Area ratio (%) | Size h/a (μm) |
| --- | --- | --- | --- | --- |
| Ex. 1 | FIG. 4 | ○ | 26 | 11/27 |
| Ex. 2 | FIG. 5 | ○ | 25 | 8.5/28 |
| Ex. 3 | FIG. 6 | ○ | 22 | 7.0/30 |
| Comp. Ex. 1 | FIG. 7 | × | — | 3.0/23 |
| Ex. 4 | FIG. 8 | ○ | 46 | 11/26 |
| Ex. 5 | FIG. 10 | ○ | 45 | 7.5/30 |
| Ex. 6 | FIG. 11 | Δ | 23 | 6.0/30 |
| Comp. Ex. 2 | FIG. 12 | × | — | 3.5/33 |

What is claimed is:

1. A light sensitive planographic printing plate comprising deposited particles on a sensitive layer, each of said deposited particles comprising a protuberant or bulging portion and a substantially flat base portion spreading around said protuberant or bulging portion, both said protuberant or bulging portion and said flat base portion being formed integrally with a same material.

2. A light sensitive planographic printing plate according to claim 1, wherein the bottom area of said protuberant or bulging portion is about 5% to about 80% based on the bottom area of said flat base portion.

3. A light sensitive planographic printing plate according to claim 1, wherein the bottom area of said protuberant or bulging portion is about 10% to about 70% based on the bottom area of said flat base portion.

4. A light sensitive planographic printing plate according to claim 1, wherein the bottom area of said protuberant or bulging portion is about 20% to about 60% based on the bottom area of said flat base portion.

5. A light sensitive planographic printing plate according to claim 1, wherein the height of said protuberant or bulging portion is about 10% to about 95% based on the height of the deposited particle.

6. A light sensitive planographic printing plate according to claim 1, wherein the height of said protuberant or bulging portion is about 30% to about 90% based on the height of the deposited particle.

7. A light sensitive planographic printing plate according to claim 1, wherein the height of said protuberant or bulging portion is about 50% to about 80% based on the height of the deposited particle.

8. A process for producing a light sensitive planographic printing plate of claim 1, which comprises heating the surface of a sensitive layer of the light sensitive planographic printing plate comprising a support and said sensitive layer disposed thereon, and then spraying on the heated sensitive layer surface an aqueous solution containing a resin dissolved therein.

9. A process for producing a light sensitive planographic printing plate according to claim 8, which comprises heating the surface of a sensitive layer of the light sensitive planographic printing plate comprising a support and said sensitive layer disposed thereon, and then spraying on said heated sensitive layer surface an aqueous solution having a viscosity of 1 to 80 cps and containing a resin dissolved therein.

10. A process for producing a light sensitive planographic printing plate according to claim 8, which comprises heating the surface of a sensitive layer of the light sensitive planographic printing plate comprising a support and said sensitive layer disposed thereon, and then spraying on said heated sensitive layer surface an aqueous solution having a viscosity of 5 to 30 cps and containing a resin dissolved therein.

11. A process for producing a light sensitive planographic printing plate according to claim 8, which comprises heating to 70° to 130° C. the surface of the sensitive layer of a light sensitive planographic printing plate comprising a support and said sensitive layer disposed thereon, and then spraying on the heated sensitive layer surface an aqueous solution containing a resin dissolved therein.

12. A process for producing a light sensitive planographic printing plate according to claim 8, which comprises heating to 75° to 90° C. the surface of the sensitive layer of a light sensitive planographic printing plate comprising a support and said sensitive layer disposed thereon, and then spraying on said heated sensitive layer surface an aqueous solution containing a resin dissolved therein.

* * * * *